United States Patent [19]

Wooding et al.

[11] Patent Number: 4,886,412
[45] Date of Patent: Dec. 12, 1989

[54] METHOD AND SYSTEM FOR LOADING WAFERS

[75] Inventors: Michael J. Wooding, Sunnyvale; Rudolfo S. Cardema, San Jose; Charles L. Ramiller, Santa Clara, all of Calif.

[73] Assignee: Tetron, Inc., Fremont, Calif.

[21] Appl. No.: 924,075

[22] Filed: Oct. 28, 1986

[51] Int. Cl.$^4$ .............................................. B65G 47/91
[52] U.S. Cl. ................................. 414/416; 414/627; 414/744.8; 414/225; 414/217; 414/737; 414/680; 414/752; 901/6
[58] Field of Search ............... 414/222, 223, 225, 416, 414/737, 217, 786, 752, 331, 744.8, 627, 680; 901/6

[56] References Cited

U.S. PATENT DOCUMENTS

| | | | |
|---|---|---|---|
| 4,293,249 | 10/1981 | Whelan | 414/217 X |
| 4,359,815 | 11/1982 | Toyoda | 901/6 X |
| 4,465,416 | 8/1984 | Burkhalter et al. | 414/217 |
| 4,500,407 | 2/1985 | Boys et al. | 414/217 X |
| 4,529,353 | 7/1985 | Dean et al. | 414/225 X |
| 4,534,695 | 8/1985 | Stump et al. | 414/225 X |
| 4,558,984 | 12/1985 | Garrett | 414/217 X |
| 4,566,726 | 1/1986 | Correnti et al. | 414/737 X |
| 4,603,897 | 8/1986 | Foulke et al. | 414/416 X |
| 4,701,096 | 10/1987 | Fisher, Jr. | 414/331 X |

FOREIGN PATENT DOCUMENTS

| | | | |
|---|---|---|---|
| 8606245 | 10/1986 | France. | |
| 0019219 | 2/1982 | Japan | 414/331 |
| 157230 | 8/1985 | Japan | 414/786 |

OTHER PUBLICATIONS

Solid State Technology, "Wafer Handling Robot", Copyright Jan. 1985.
"The Dawn of Epitaxy's New Era", May 1986, Semiconductor Intnl., pp. 69–72.
"Next Generation Epitaxial Silicon Deposition System", May 1986, Semiconductor International, pp. 250–251.

*Primary Examiner*—Frank E. Werner
*Attorney, Agent, or Firm*—Townsend & Townsend

[57] ABSTRACT

A wafer transport system includes a mobile frame, a wafer cassette conveyor, a wafer support table, and a wafer transfer assembly. The wafer cassette conveyor carries a plurality of wafer cassettes and presents them successively to a transfer location. The wafer transport assembly, including a robotic arm and a vacuum pickup element, is then able to transport individual wafers from the cassettes to the support table. By rotating the support table, a plurality of wafers can be placed in a desired order. The wafer support table may then be moved to a location proximate a processing chamber, such as a chemical vapor deposition reactor, and processed and unprocessed wafers efficiently exchanged by the transport assembly.

11 Claims, 6 Drawing Sheets

METHOD AND SYSTEM FOR LOADING WAFERS

BACKGROUND OF THE INVENTION

1. Field of the Invention

The present invention relates generally to a method and apparatus for transporting individual semiconductor wafers in semiconductor processing applications, and more particularly to a method and apparatus for transferring wafers from wafer cassettes to a wafer processing chamber, such as a chemical vapor deposition reactor.

2. Description of the Background Art

Semiconductor processing operations in general require a very high throughput of wafers in order to reduce the processing cost of each individual integrated circuit. Such rapid processing, however, requires that the wafers be precisely and carefully handled and that very clean conditions be maintained at all times. Imprecise handling of wafers, which allows undesired contact between the wafers and the reactor and other surfaces, can both damage the circuits formed thereon and result in the generation of particulates which can diminish cleanliness and interfere with subsequent processing steps. Thus, it is a common goal of semiconductor process designers to be able to increase wafer throughput without resorting to imprecise wafer handling techniques which can damage the wafers and result in generation of particulate contaminants.

The ability to manipulate individual wafers during semiconductor processing is further complicated in high temperature systems, such as chemical vapor deposition reactors, where thermal cycling over wide temperature ranges can result in deformation of the wafer support platforms and loss of mechanical repeatability in the system, such as the susceptors in epitaxial deposition processes. Such deformation makes it very difficult to design mechanical systems for wafer transfer, since the precise locations of the wafer supports within the reactor will vary over time. Moreover, the need for wafers to cool prior to being returned to wafer cassettes further slows down the processing time for high temperature processes.

Therefore, it would be desirable to provide a method and system for rapidly transferring semiconductor wafers to and from a processing chamber in a manner which minimizes impact and contact between the wafers and the transporting equipment. It would be particularly desirable if such methods and systems provided for intermediate cooling of the wafers after they are removed from the processing chamber and before they are replaced in the wafer cassettes, and further provided for the ability to selectively remove wafers from a plurality of cassettes and place those wafers in a predefined order within the processing chamber. Additionally, it would be desirable if methods and systems allowed for maintaining the wafers in a substantially vertical orientation during all phases of manipulation. Such vertical orientation decreases the likelihood that dust or other contaminants will settle on the surface of the wafers.

SUMMARY OF THE INVENTION

The present invention comprises a method and system for transferring semiconductor wafers between a plurality of wafer cassettes, and a processing chamber, such as a chemical vapor deposition (CVD) reactor. The system utilizes an intermediate wafer support surface for arranging and transporting individual wafers between the cassettes and the processing chamber. By supporting the plurality of cassettes on a closed conveyor means, conveniently a vertical wheel, the cassettes may be brought to the wafer support surface in any desired order. A transfer mechanism, typically an articulated arm having a vacuum pickup head, is used to grasp individual wafers in the adjacent cassette and transfer them to individual receptacles on the wafer support surface. The support surface is then moved adjacent to the processing chamber, and the same transfer mechanism is used to transfer the individual wafers from the wafer support to suitable wafer holders within the chamber, such as a susceptor in the case of CVD reactors.

The system of the present invention as just described has a number of advantages. First, the wafers may be arranged on the wafer support surface during the period when the processing chamber is in operation, thus reducing the time necessary to ultimately transfer the wafers into the processing chamber. Second, wafers from different cassettes may be placed on the support surface in any desired order, facilitating the placement of test wafers at desired locations in the processing chamber. When processing has been completed in the chamber, the support surface may be brought into proximity with the wafer receptacle in the chamber to facilitate the exchange of individual wafers. Empty slots for holding individual wafers are left in either the support surface, the processing chamber, or both, so that the transfer mechanism can carry a wafer between the wafer support surface and the processing chamber with one stroke, place the wafer in an empty slot, grasp a new wafer, and carry the new wafer back to the support on a return stroke. In this way, idle time of the reactor needed to load and unload wafers is minimized. Third, use of the intermediate wafer support also provides for cooling of heated wafers, resulting from CVD and like processes, prior to transfer to the cassettes. This is an advantage over many prior art processes where the wafers must be cooled in the processing chamber or on the transfer mechanism prior to depositing back in the wafer cassettes. Fourth, use of the manipulable transfer asembly allows the individual wafers to be maintained substantially vertically at all times during transfer, to limit surface contamination from settling particulates.

In the preferred embodiment, the wafer cassettes are suspended on a vertical wheel which may be rotated to bring the individual cassettes to a desired transfer location. The intermediate wafer support is a horizontal wheel having a plurality of individual wafer receptacles thereon. The wafer support wheel may also be rotated to bring the individual receptacles to the transfer location. The transfer arm is mounted at the center of the wafer support wheel, and its operation is microprocessor controlled. After initially positioning the vertical cassette wheel and the wafer support wheel, the transfer arm is calibrated to determine the precise location of the wafers within the cassette and the wafers on the wafer support wheel. In this way, wafers may be precisely manipulated by the vacuum pickup head on the transfer arm without unnecessary friction and impact which can result in damaged wafers and particulate generation.

DETAILED DESCRIPTION OF THE PREFERRED EMBODIMENT

Figure 1:
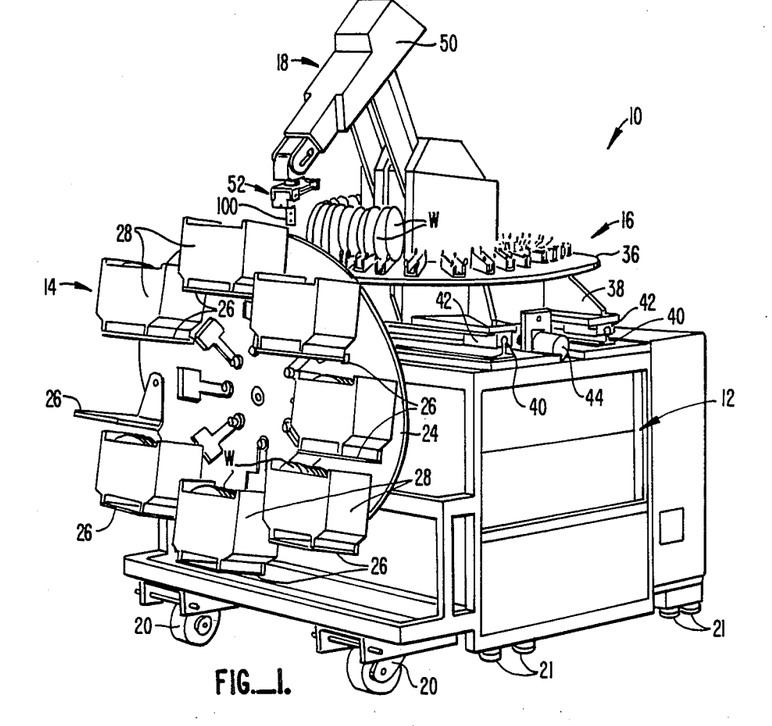
FIG. 1 is a perspective view of the wafer transport system of the present invention.

Referring to FIG. 1, a wafer transport system 10 constructed in accordance with the principles of the present invention includes an enclosed frame 12, a wafer cassette conveyor 14, a wafer support table 16, and a wafer transfer assembly 18. The enclosed frame 12 is mounted on retractable casters 20 and includes side guide wheels 21 to facilitate moving the system 10 to and from a wafer processing reactor, as will be described in more detail with reference to FIG. 2. Various functions of the wafer transport system 10 are generally electrically powered and controlled, and the necessary electrical drive and control equipment are mounted inside the enclosed frame 12. Usually, the functions will be controlled by a microprocessor control system (not illustrated) supervised by external computer controller (not illustrated). The ability to provide such control systems is well within the skill of the art, and the necessary implementation of the control functions of the present invention will not be described in detail.

The wafer cassette conveyor 14 is intended to support a plurality of wafer cassettes 28 and to selectively transport the wafer cassettes to a particular location from which individual wafers may be removed for eventual transfer to the wafer processing equipment. The wafer cassette conveyor 14 comprises a vertical wheel 24 rotatably mounted on frame 12. The vertical wheel 24 includes eight cassette support plates 26 pivotally mounted about its periphery. The support plates 26 are designed to receive wafer cassettes 28 on their upper surface. As the support plates 26 are pivotally mounted, the wafer cassettes 28 will be maintained in a substantially vertical orientation as the wheel 24 is rotated. Use of a vertical wheel is preferred in order to conserve space. It will be appreciated, however, that substitution of a horizontal wheel, or any other form of cassette conveyor, is contemplated within the scope of the present invention.

The wafer cassettes 28 are conventional wafer cassettes of the type used to transport individual wafers W during semiconductor processing operations. Support plates 26 are configured to receive the cassettes 28 in a particular orientation, but for the reasons described more fully hereinbelow, the precise location of the wafers within the cassettes may vary within fairly wide tolerances. The wafer transport system 10 of the present invention is designed to account for these tolerances without loss of transfer efficiency or damage to the wafers W that are being handled.

The vertical wheel 24 is driven by gear motor 30 (FIG. 5), which is connected through a clutch 32 and a geneva mechanism 34. The wheel may be rotated through any desired angle in order to bring a desired cassette 28 to the transfer location, which is at the 12 o'clock position as illustrated in FIG. 1. Usually, a mechanical lock system (not illustrated) will be used to lock the cassette support plate 26 firmly when the desired cassette 28 is at the transfer location.

Figure 7:
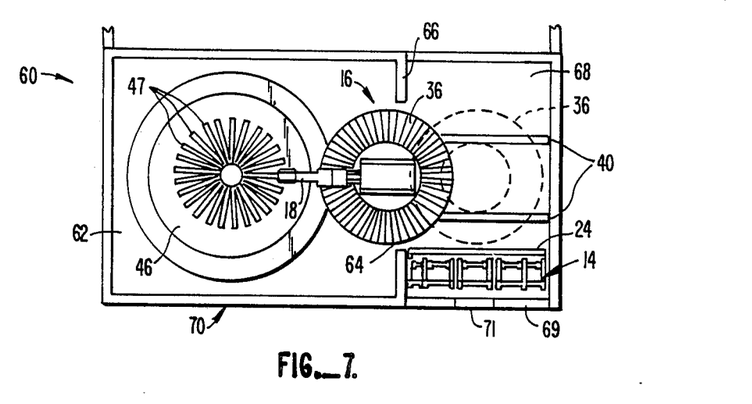
FIG. 7 is a top schematic view of the system of FIG. 2.
Figure 8:
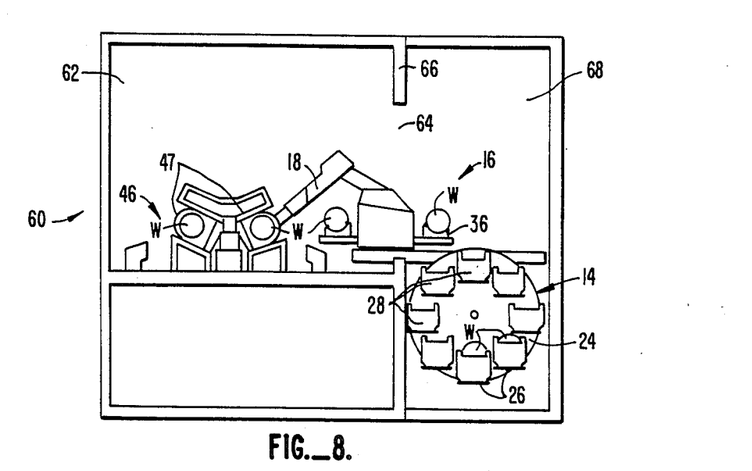
FIG. 8 is a schematic elevational view of the system of FIG. 2.
Figure 9:
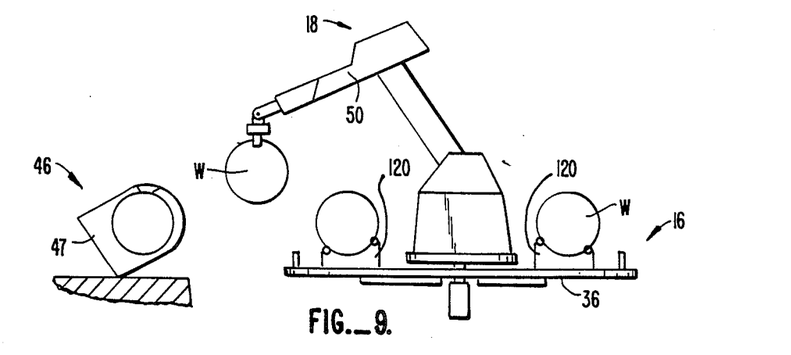
FIG. 9 is a schematic view illustrating the transfer of individual wafers from the wafer support table to the epitaxy susceptor.

The wafer support table 16 (FIGS. 1, 5, and 6) comprises a platform 36 rotatably mounted on a base 38 (FIG. 1). The base 38, in turn, is mounted on a pair of horizontal tracks 40 by bearing members 42. A drive motor 44, typically a stepper or DC servo motor, is connected to a linkage (not illustrated), such as a helix drive or a leadscrew, for translating the wafer support table 16 back and forth across the top of the frame 12. As will be described in more detail hereinafter, in a first position (as illustrated in FIG. 1) the wafer support table 16 is in position for the wafer transfer assembly 18 to transfer individual wafers W from the cassettes 28 to the upper surface of platform 36. In a second position (as illustrated in FIGS. 7, 8, and 9), the wafer support table 16 is in a position for the transfer assembly 18 to transfer wafers W between a susceptor 46 (FIGS. 7 and 8) and the platform 36.

The wafer support table 16 serves as a staging area for prearranging wafers W which are being transported from the wafer cassettes 28 to the process reactor and for cooling wafers which are being transferred from the reactor back to the cassettes. In both cases, the staging allows relatively time consuming manipulation of the wafers to take place while the reactor is in operation. By placing the wafers W in a desired order on platform 36, the wafers may be rapidly exchanged between the platform and a support surface in the reactor. For example, it will frequently be desirable to place test wafers and dummy wafers at certain locations within a reactor. By selecting the proper cassette 28 on conveyor 14, transfer assembly 18 can place a wafer W in any desired receptacle on platform 36. As the wafers W are thus in a desired order, they may be rapidly transferred to the reactor without having to search for the proper receptacle. Staging also provides a place for wafers W to cool down before they are transferred back to the wafer cassettes 28. Moreover, the ability of the wafer support table 16 to travel between a location proximate wafer cassette conveyor 14 and a location proximate the reactor further reduces the time necessary to effect transfer of all wafers into and out of the reactor. That is, the wafer support platform 36 may be brought immediately adjacent a reactor susceptor 46 (as illustrated in FIGS. 7, 8, and 9) and, by rotating both the platform 36 and the susceptor 46, the wafers W may be exchanged by a simple back-and-forth motion of the wafer transfer assembly 18, as will be described in more detail hereinafter.

The wafer transport assembly 18 comprises a conventional robotic arm 50 (FIG. 3) having multiple degrees of motion and a specially-designed vacuum pickup tool 52 which is able to both sense the location of wafers W and grasp the wafers for manipulation by the arm 50.

Figure 2:
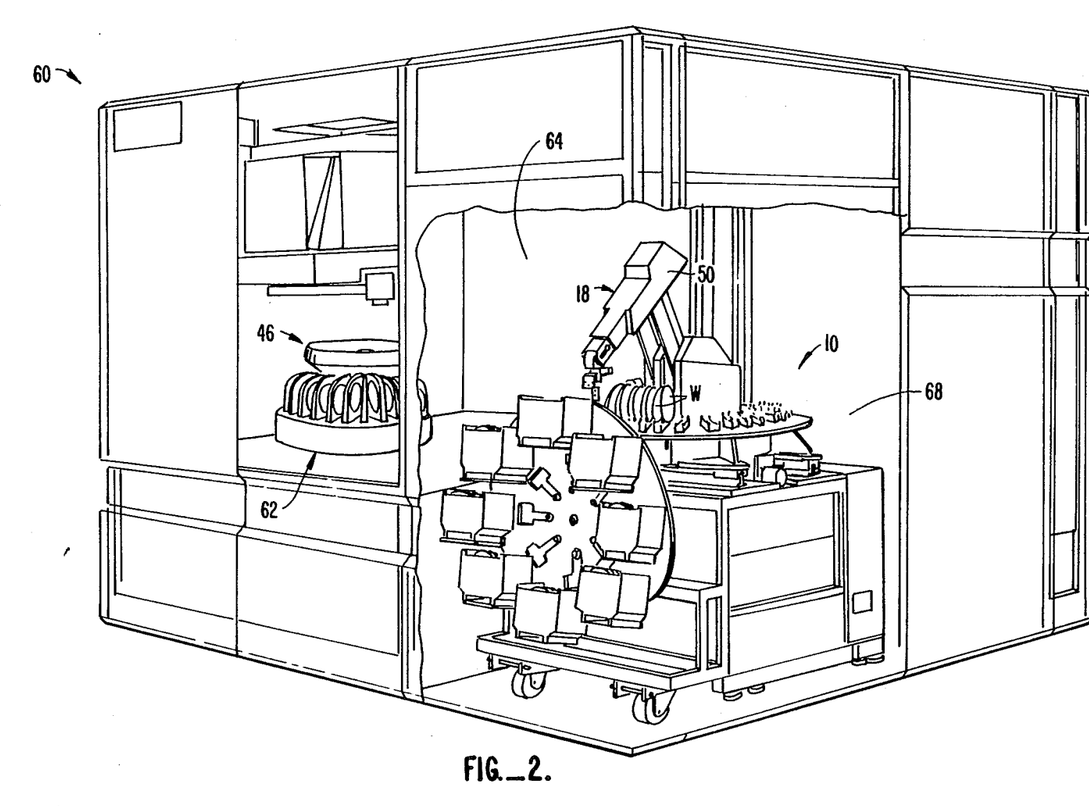
FIG. 2 is a perspective view of the wafer transport system of the present invention shown in use with an epitaxy reactor.

Referring now to FIG. 2, the wafer transport system 10 is illustrated in position within a chemical vapor deposition reactor 60 of the type utilized for epitaxial deposition. The reactor 60 includes the circular, rotatable susceptor 46 which supports individual wafers W in a reactor chamber 62. The reactor 60 includes an opening 64 in a wall 66 (FIGS. 7 and 8) which separates the reactor chamber 62 from an antechamber 68. A retractable door (not illustrated) is used to seal off the reactor chamber 62 from the antechamber 68 while the reactor is in operation.

The wafer transport system 10 will generally remain in place inside of antechamber 68, but may be moved in and out of the antechamber through a main door 69 FIG. 7) in a front wall 70 for cleaning, repair, maintenance, and the like. Exchange of individual cassettes 28 may be effected through a smaller door 71 (within door 69) located approximately at the 12 o'clock position of wheel 24. Alignment pins (not illustrated) are provided on the transport system 10 and/or in the interior of antechamber 68 to assure proper placement of the system 10 relative to the reactor 60. Generally, the system 10 will be accurately placed on a three point suspension system during use. The antechamber 68 will be maintained under clean room conditions with laminar airflow, and access through the smaller door 71 helps limit the introduction of contaminants.

Figure 3:
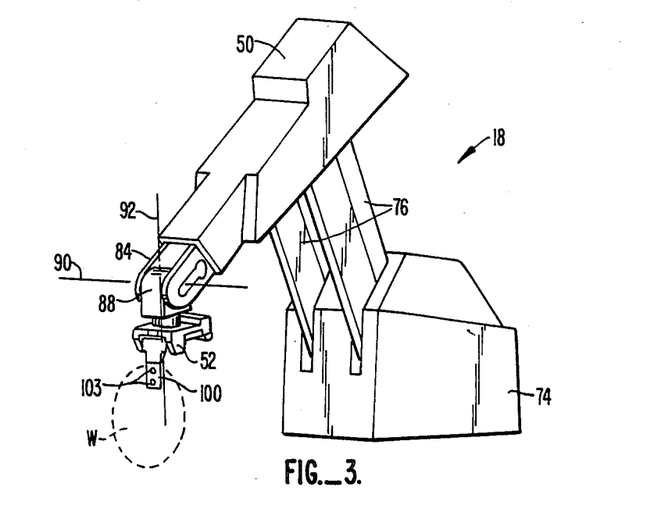
FIG. 3 is a detailed perspective view of the mechanical transfer arm and vacuum pickup head assembly of the present invention.
Figure 5:
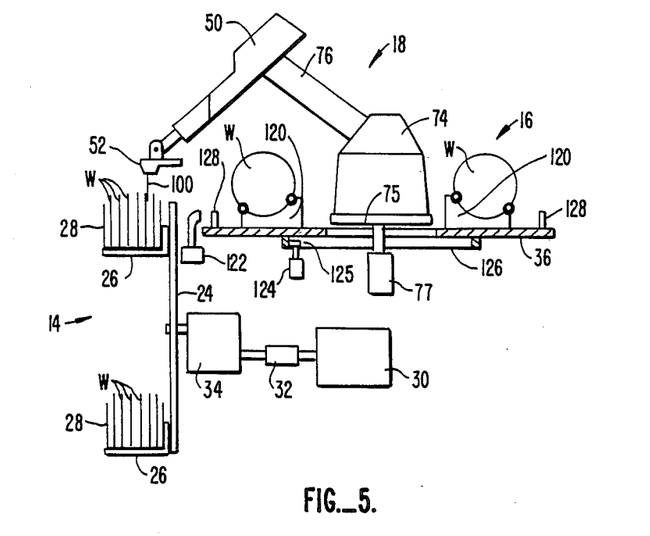
FIG. 5 is a schematic view illustrating the pickup and transfer of individual wafers from the wafer cassettes to the wafer support table of the present invention.

Referring now in particular to FIGS. 3 and 5, the wafer transport assembly 18 includes the vacuum pickup tool 52 mounted on the robotic arm 50. The arm 50 is mounted on a base 74 by a parallelogram assembly 76 which allows the distal end of arm 50 to move freely within predefined limits, typically a 15 inch square. The base 74 is mounted on support plate 75 which may be rotated by driver 77, typically a stepper motor or DC servo motor. Thus, the entire transfer assembly 18 may be rotated about a vertical axis relative to frame 12. A clevis 84 is mounted at the distal end of arm 50, and a mounting block 88 is secured to rotate in the clevis 84 about a pitch axis 90. The vacuum pickup tool 52 is mounted to rotate relative to the mounting block 88 about a roll axis 92, and the motion of the various components of the wafer transfer assembly 18 are controlled by stepper motors, DC servo motors or other motors capable of very accurate control. Conveniently, a commercial robot arm may be employed, such as the Model No. 1000 available from Precision Robots, Inc., Woburn, Mass.

Figure 4:
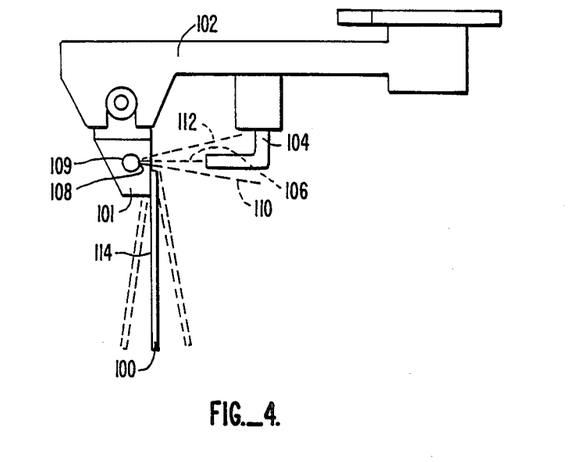
FIG. 4 is a detailed schematic view of the vacuum pickup head of the present invention.

The vacuum pickup head 52 is illustrated in detail in FIG. 4, and includes a card-shaped pickup element 100 secured to block 101 which is pivotally mounted on a support plate 102. The pickup element 100 is coated with a temperature-resistant, non-contaminating material, such as a polyimide, e.g., Vespel ® available from DuPont de Nemours, Wilmington, Del., on the surface which contacts the wafers W. It is important that no metals contact the wafer surface since metals are highly contaminating. The polyimide is highly stable and pure so that no contaminating substances are transferred to the wafer W through contact. Such contamination can be a problem with high temperature processes, such as CVD. Other temperature resistant materials and coatings such as glass, quartz, and ceramics, e.g., silicon carbide, may also find use.

A pair of vacuum ports 103 (FIG. 3) are provided in the contact surface and connected to a vacuum system. The wafers may be manipulated by contacting the pickup element 100 so that both ports are covered and then drawing a vacuum to firmly secure the wafer. The wafer W may then be deposited in a desired location by properly manipulating the transport assembly 18 and cutting the vacuum at the appropriate time.

Block 101 is spring mounted so that pickup element 100 is held at an approximately right angle relative to the support plate 102, but may deviate from such a position (as illustrated in broken line) when the element 100 encounters an object, such as a wafer or wafer cassette.

An optical wave guide 104 projects a light beam 106 onto a reflective surface 108 of a pin 109 mounted on block 101. Wave guide 104 is also able to detect light reflected from the reflective surface 108 and transmit such reflected light back to a conventional light detector (not illustrated).

The wave guide 104 and light detector are thus able to detect deviations in the position of the pickup element 100 in the following manner. When the pickup element 100 is in its centered rest position, as illustrated in full line in FIG. 4, beam 106 is reflected directly back into the wave guide 104, resulting in a particular intensity detected by the light detector. When the position of the pickup element 100 deviates due to contact with a fixed object, the position will be as illustrated in broken line. Because of this change of position, the reflected light will deviate away from the wave guide 104, as illustrated by paths 110 and 112. Thus, there will be a variation in light intensity which results from the pickup element 100 encountering a fixed object. This variation in light intensity can trigger a change in logic levels which is fed to the microprocessor controller, which signal is used in locating the precise position of wafers, wafer carrier plates, and obstructions during the operation of the system of the present invention, as described in more detail hereinbelow.

Figure 6:
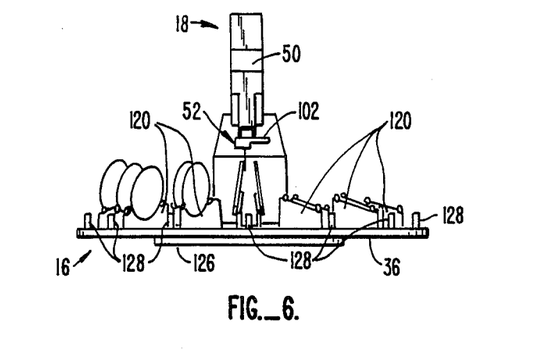
FIG. 6 is a schematic view illustrating the placement of wafers on the wafer support table.
Figure 6A:
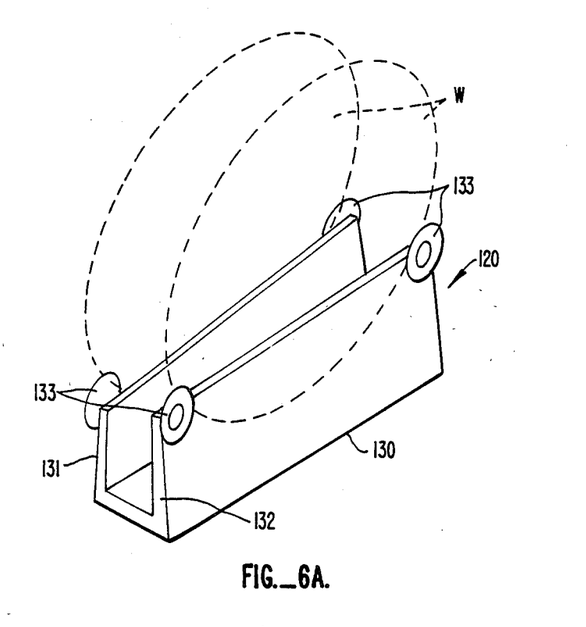
FIG. 6A is a detail view illustrating the wafer receptacles which hold individual wafers on the support table.

Referring now to FIGS. 5, 6, and 6A, the transfer of wafers W from the wafer cassette conveyor in 14 to the wafer support table 16 will be described detail. Initially, vertical wheel 24 of the cassette conveyor 14 is rotated until a desired cassette 28 is raised into the transfer position. After positioning, the support plate 26 carrying the desired cassette 28 is locked in position. Next, platform 36 of the wafer support table 16 is rotated to bring a desired wafer receptacle 120 into position proximate the wafer cassette conveyor 14.

An optical detector 122 is utilized to sense the position of each receptacle 120 on platform 36 and feed back to the microprocessor controller (not illustrated) which controls a positioning motor 124 which drives a wheel 125 which engages an annular ring 126 formed on the bottom of platform 36. The detector 122 projects a light beam and detects light reflected from a plurality of dowel pins 128, one of which is located adjacent each of the wafer receptacles 120. The controller can thus keep track of the position of platform 36 by counting the dowel pins 128 as they pass before it. Conveniently, an extra dowel pin (not illustrated) may be provided for initialization of the system at startup or any other desired time.

The wafer receptacles 120 (FIG. 6A) include a base member 130 having a pair of upright walls 131 and 132.

Figure 6B:
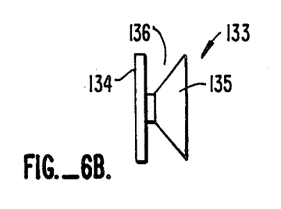
FIG. 6B is a detail view illustrating the wafer rests on the wafer receptacles.

Each wall 131 and 132 includes a pair of wafer rests 133. Each wafer rest 133 (FIG. 6B) includes a disk portion 134 and a cone portion 135 arranged in an opposing manner to define a V-shaped channel 136 for receiving the wafer W. The wafer rests 133 are formed from a non-metallic temperature resistant material, usually a polyimide, glass, quartz, or ceramic, as described above for the pickup element 100, in order to avoid contamination of the wafer. Conveniently, the wafer rests 133 will be inclined slightly inward, usually about 3° C. from vertical, so that the wafers W will converge toward each other at the top. Such an inclination acts to hold the wafers W steady as the support platform 36 is rotated and translated between the reactor and the wafer cassette conveyor 14. Generally, the wafers W will be placed with the active surfaces facing outward, with the pickup element 100 contacting them from the rear.

Once the wafer cassette conveyor 14 and wafer support table 16 are properly positioned, the wafer transfer assembly 18 will be used to transfer wafers W from the cassette 28 to the wafer receptacles 120 in the following manner. The following description assumes that a sufficient number of receptacles 120 are available to accomodate all wafers W which are to be placed in the reactor, i.e., that the platform 36 will have been unloaded prior to this loading operation. Prior to loading, the position of the robotic arm 50 of the wafer transport assembly 18 is initialized by contacting the pickup element 100 of the vacuum pickup tool 52 with a low force contact switch located at a fixed position on the system 10. This initial position serves as a reference to detect errors in the system resulting from misalignments, failures, and the like.

Referring in particular to FIGS. 5 and 6, in order to transfer wafers W from the wafer cassettes 28 to the platform 36, the robotic arm 50 of the wafer transport assembly 18 must first determine the precise location of the cassettes. Placement of the cassettes 28 on the support plates 26 will vary somewhat, and the cassettes themselves will deform over time. In order to avoid damaging the wafers and to minimize particulate generation, it is desirable that the wafers W be removed cleanly from the cassettes 28 without unnecessary contact with the cassette walls. In order to avoid such unnecessary contact, the robotic arm 50 of the transport assembly 18 is calibrated each time it encounters a newly-positioned cassette 28.

Calibration of the wafer transport assembly 18 to the cassettes 28 is accomplished by locating the first wafer W in the cassette 28 by contacting the pickup element 100 of the vacuum pickup tool 52 against that wafer. The tool 52 senses the precise position of the wafer W (as described in connection with FIG. 4, above) and, after grasping the wafer, is able to position itself so that the wafer will have minimum contact with the cassette as the wafer is being withdrawn.

After withdrawing the wafer W from cassette 28, the robotic arm 50 of the wafer transport assembly 18 turns the wafer approximately 90° and carries the wafer over to the wafer support table 16 proximate to an empty pair of rests 133 in a wafer receptacle 120. The robotic arm 50 will have previously located the precise position of a pair of wafers W in a wafer receptacle 120, and will thus be able to align the robot arm 50 with the appropriate slot of a wafer receptacle 120. Conveniently, a permanent pair of dummy wafers may be left on the platform 36 for this purpose.

In normal operation, the robotic arm 50 of the wafer transport assembly 18 will then move to a second wafer W in the cassette 28 and remove a wafer therefrom. The robotic arm 50 has already been precisely calibrated so that the wafer W can be pulled from the cassette 28 with minimum contact. The wafer W is placed in an empty pair of wafer rests 133 in a receptacle 120, and the process continued until the platform 36 holds all desired wafers W. Conveniently, different cassettes 28 may be brought to the transfer location at any time to facilitate placing the wafers in a desired order on the platform 36.

Once a new batch of unprocessed wafers W, test wafers, and blank wafers have been loaded onto the platform 36 of the wafer support table 16, transport system 10 waits until processing of the wafers within the reactor 62 is completed. Once completed, the door (not illustrated) enclosing the reactor chamber 62 is opened, and the platform 36 moved next to the susceptor 46 on tracks 40 (FIGS. 7 and 8). The processed wafers W on the susceptor 46 are then exchanged for the unprocessed wafers W on the platform 36 in the following manner.

Figure 10:
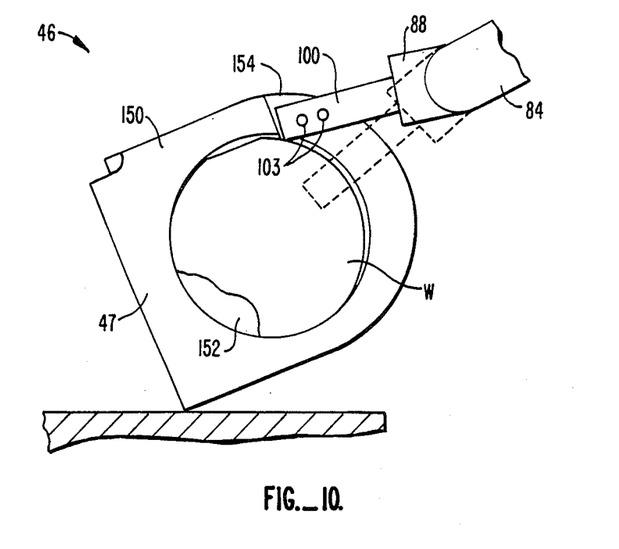
FIG. 10 is a detailed schematic view illustrating the pickup of a wafer from the epitaxy susceptor.

Referring to FIGS. 9 and 10, the robotic arm 50 of the wafer transport assembly 18 locates the position of carrier plates 47 on the susceptor 46, by sensing the position of a first plate with the pickup element 100 of vacuum pickup head 52. Once the position of a single plate is known, the controller can sense the relative positions of all other plates on susceptor 36. With the positions of the plates 47 being known, the robotic arm 50 can lift the individual wafers W in a manner which minimizes contact with the plates 47 in order to minimize damage to the wafer and particulate generation. Each processed wafer W may then be carried back and placed in an empty pair of wafer rests 133 in a wafer receptacle 120 on platform 36. The remaining processed wafers W are then exchanged between the platform 36 and the susceptor 46, with the platform and the susceptor being incrementally rotated to bring successive pairs of wafers to a position adjacent to the next empty carrier plate 47 or wafer receptacle 130. After the transfer is complete, the platform 36 may be withdrawn from the reactor chamber 62, the chamber sealed and processing of the new batch of wafers commenced.

Referring in particular to FIG. 10, carrier plates 47 may be specially constructed to provide improved epitaxial deposition, as described in copending application Ser. No. 662,879, the disclosure of which is incorporated herein by reference. The carrier plates 47 have a pair of inclined surfaces 150, only one of which is visible in FIG. 10. Each face 150 defines a cavity 152 which receives the wafer W. The wafer W remains in place within the cavity 152 because of the inclination, and such support provides a number of processing advantages as described in the incorporated patent application.

The present invention provides a particularly convenient method for transferring wafers W to and from the carrier plates 47. To remove a wafer W, the pickup element 100 is inserted behind the wafer W using a slot 154 formed in the carrier plate. The pickup element 100 first tips the wafer W away from plate 47 (while in the position shown in full line) and the pick up element is lowered to the position shown in broken line. A vacuum is then drawn through ports 103, and the wafer lifted away. Wafers W are replaced in the cavity 152 by first lowering the wafer into the cavity at a small inclination. After breaking the vacuum, the pickup element 100 can be moved out from behind the wafer, and the wafer will gently fall into the cavity.

The advantage of this particular design for the carrier plates lie in the very small access space required behind the wafer. Such small space minimized deposition on the opposite side of the wafer, which is undesirable for a variety of reasons.

Critical to the present invention is the ability of the pickup element 100 to sense the precise positions of wafers W within the cassettes 28, the wafer receptacles 120, and the carrier plates 47. Because of a number of factors, including time, thermal cycling, control hysteresis, and the like, the mechanical structure of the system 10 cannot be relied on to precisely and repeatably locate all components which contact and support the wafers. By locating the positions of the wafers within the cassettes 28 and the other components of the system 10, however, it is possible for the microprocessor controller to adjust the positioning of the robotic arm 50 to account for variations in position of the components over time. Thus, the wafers W may be precisely positioned at every location within the system 10 to avoid damage to the wafers and unnecessary particulate generation.

Although the foregoing invention has been described in some detail by way of illustration and example for purposes of clarity of understanding, it will be obvious that certain changes and modifications may be practiced within the scope of the appended claims.

What is claimed is:

1. A system for transferring semiconductor wafers between a processing vessel and wafer cassettes, said system comprising:
   a frame capable of being positioned proximate the processing vessel;
   means mounted on the frame for transporting a plurality of wafer cassettes along a closed path;
   a support surface rotatably mounted on the frame;
   means on the support surface for holding a plurality of individual wafers in a generally vertical orientation;
   means mounted on the frame for rotating the support surface;
   a robotic arm assembly having a base positioned at the center of the rotatably mounted support surface and a manipulable arm which extends from the base and which can be selectively positioned relative to the frame;
   means mounted on the arm for detachably securing individual wafers; and
   means for manipulating the arm.

2. A system as in claim 1, wherein the means for transporting includes a wheel having means for supporting the cassettes distributed about its periphery, and means for selectively rotating the wheel.

3. A system as in claim 2, wherein the wheel is arranged to rotate in a substantially vertical plane.

4. A system as in claim 1, wherein the frame is a mobile frame.

5. A system for transferring wafers between a processing vessel and wafer cassettes, said system comprising:
   a frame capable of being positioned proximate the processing vessel;
   a vertical wheel rotatably mounted on the frame;
   means on the wheel for supporting a plurality of wafer cassettes in a generally vertical orientation;
   means on the frame for rotating the wheel to move the cassettes past a fixed location;
   a horizontal support surface rotatably mounted on the frame;
   means on the support surface for holding a plurality of individual wafers;
   means on the frame for rotating the support surface;
   a robotic arm assembly including a base positioned at the center of the horizontal support surface and a manipulable arm which extends from the base and which can be selectively positioned relative to the frame;
   means mounted on the arm for detachably securing individual wafers; and
   means for manipulating the arm so that wafers can be secured and transported (a) the cassettes, (b) the means for holding on the rotatably mounted horizontal support surface, and (c) a location in the processing vessel.

6. A system as in claim 5, further including means for translating the horizontal support surface relative to the frame so that said surface may be moved between a position proximate the vertical wheel and a position proximate the processing vessel.

7. A system as in claim 6, wherein the means for translating includes linear tracks mounted on the frame.

8. A system as in claim 5, wherein the means for supporting the wafer cassettes includes a plurality of plates pivotally suspended from the periphery of the wheel.

9. A system as in claim 5, wherein the means for holding on the support surface holds the wafers substantially vertically.

10. A system as in claim 5, wherein the means for securing individual wafers includes a vacuum pick-up head.

11. A system as in claim 10, wherein the means for manipulating includes means for extending the robotic arm radially, means for changing the elevation of the arm, means for rotating the arm, and means for rolling the vacuum pick-up head.

* * * * *